(12) United States Patent
Nomura (10) Patent No.: US 10,775,865 B2
(45) Date of Patent: Sep. 15, 2020

(54) MEMORY SYSTEM INCLUDING A NONVOLATILE MEMORY AND A VOLATILE MEMORY, AND METHOD

(71) Applicant: TOSHIBA MEMORY CORPORATION, Minato-ku (JP)

(72) Inventor: Shuou Nomura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/290,004

(22) Filed: Mar. 1, 2019

(65) Prior Publication Data

US 2020/0064897 A1 Feb. 27, 2020

(30) Foreign Application Priority Data

Aug. 23, 2018 (JP) ................................. 2018-156618

(51) Int. Cl.
| | |
|---|---|
| *G11C 5/14* | (2006.01) |
| *G06F 1/30* | (2006.01) |
| *G11C 8/12* | (2006.01) |
| *G11C 11/56* | (2006.01) |
| *G11C 16/34* | (2006.01) |

(52) U.S. Cl.
CPC ................. *G06F 1/30* (2013.01); *G11C 5/141* (2013.01); *G11C 5/144* (2013.01); *G11C 8/12* (2013.01); *G11C 11/5635* (2013.01); *G11C 16/3445* (2013.01); *G11C 16/3459* (2013.01); *G11C 2211/5641* (2013.01)

(58) Field of Classification Search
CPC . G11C 16/3459; G11C 11/5635; G11C 5/144; G11C 16/3445; G11C 5/141; G11C 8/12; G11C 2211/5641; G06F 1/30
See application file for complete search history.

(56) References Cited

U.S. PATENT DOCUMENTS

| | | | | |
|---|---|---|---|---|
| 2006/0059385 | A1* | 3/2006 | Atri ...................... | G06F 11/1441 714/14 |
| 2010/0023682 | A1* | 1/2010 | Lee ...................... | G06F 12/0246 711/103 |
| 2011/0314204 | A1 | 12/2011 | Ootsuka et al. | |

(Continued)

FOREIGN PATENT DOCUMENTS

JP 2012-008651 1/2012

*Primary Examiner* — Khamdan N. Alrobaie
(74) *Attorney, Agent, or Firm* — Oblon, McClelland, Maier & Neustadt, L.L.P.

(57) ABSTRACT

According to one embodiment, a memory system includes a nonvolatile first memory, a volatile second memory, a capacitor, and a memory controller. The nonvolatile first memory includes a storage region that includes a plurality of memory cells. The capacitor is configured to accumulate electric power. The memory controller writes first data stored in the volatile second memory to the storage region in a first mode, using a power supply from outside. The first mode is a mode in which one-bit data is written to each of the memory cells. The memory controller writes, upon stop of the power supply from the outside, the first data to the storage region in a second mode, using the electric power accumulated in the capacitor. The second mode is a mode in which one-bit data is written to each of the memory cells and is different from the first mode.

20 Claims, 6 Drawing Sheets

(56) References Cited

U.S. PATENT DOCUMENTS

| | | | |
|---|---|---|---|
| 2012/0063255 A1* | 3/2012 | Nakazumi | G06F 11/1441 365/228 |
| 2015/0179269 A1 | 6/2015 | Lee | |
| 2015/0324119 A1* | 11/2015 | Romanovsky | G06F 12/08 711/103 |
| 2016/0162354 A1 | 6/2016 | Singhai et al. | |
| 2016/0254031 A1* | 9/2016 | Noguchi | G11C 5/02 365/185.08 |
| 2017/0068488 A1* | 3/2017 | Shibatani | G06F 12/0246 |
| 2019/0196733 A1* | 6/2019 | Lee | G06F 3/0647 |

\* cited by examiner

MEMORY SYSTEM INCLUDING A NONVOLATILE MEMORY AND A VOLATILE MEMORY, AND METHOD

CROSS-REFERENCE TO RELATED APPLICATIONS

This application is based upon and claims the benefit of priority from Japanese Patent Application No. 2018-156618, filed on Aug. 23, 2018; the entire contents of which are incorporated herein by reference.

FIELD

Embodiments described herein relate generally to a memory system and a method.

BACKGROUND

Conventionally, memory systems including a nonvolatile memory and a volatile memory are known. The nonvolatile memory functions as storage. The volatile memory is used as a buffer of data to be written onto the nonvolatile memory, or as an area in which various kinds of management data are stored.

Such a memory system may include a capacitor. Upon detecting stop of a power supply, the memory system writes data stored in the volatile memory to the nonvolatile memory, using electric power accumulated in the capacitor. Thereby, data is saved from the volatile memory to the nonvolatile memory. This prevents loss of the data from the memory system. Such a function is known as a power loss protection (PLP) function.

DETAILED DESCRIPTION

In general, according to one embodiment, a memory system includes a nonvolatile first memory, a volatile second memory, a capacitor, and a memory controller. The nonvolatile first memory includes a storage region that includes a plurality of memory cells. The capacitor is configured to accumulate electric power. The memory controller is configured to write first data stored in the volatile second memory to the storage region in a first mode, using a power supply from outside. The first mode is a mode in which one-bit data is written to each of the memory cells. The memory controller is further configured to write, upon stop of the power supply from the outside, the first data to the storage region in a second mode, using the electric power accumulated in the capacitor. The second mode is a mode in which one-bit data is written to each of the memory cells and is different from the first mode.

Exemplary embodiments of a memory system and a method will be explained below in detail with reference to the accompanying drawings. The present invention is not limited to the following embodiments.

Embodiment

Figure 1:
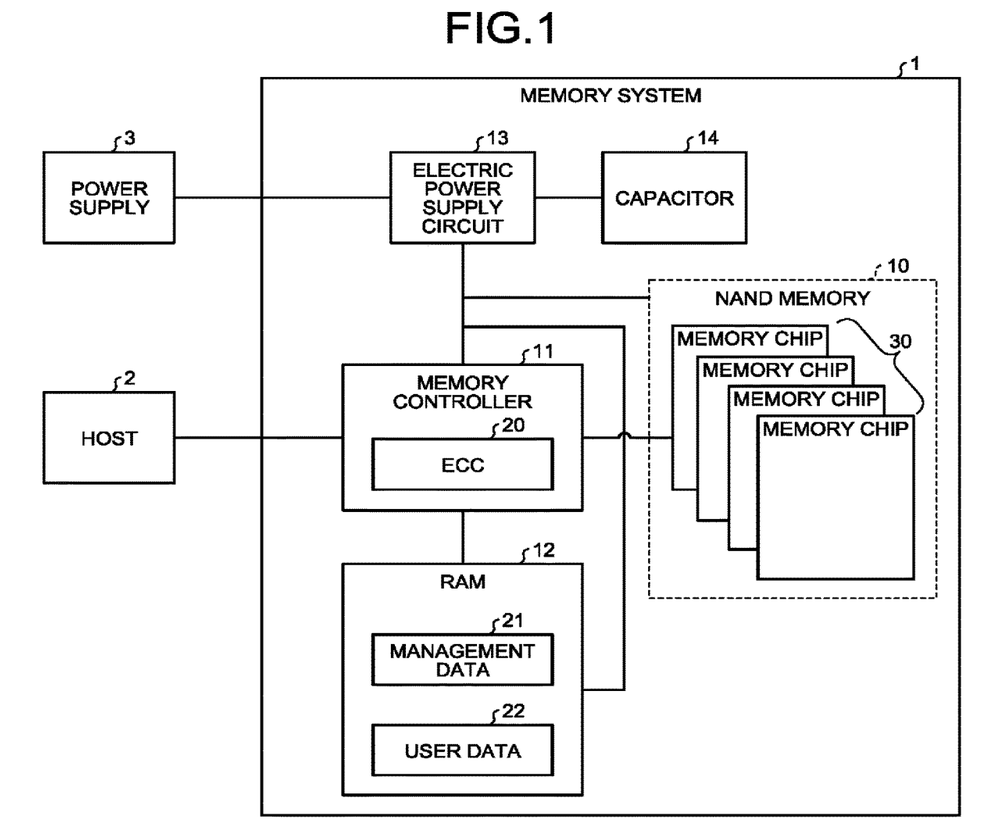
FIG. 1 is a view illustrating an exemplary configuration of a memory system of an embodiment.

FIG. 1 is a view illustrating an exemplary configuration of the memory system of the embodiment. A memory system 1 is connected to a host 2 via a certain communication interface. The host 2 represents, for example, a personal computer, a portable information terminal, or a server.

The memory system 1 is connected to a power supply 3 provided outside of the memory system 1, and is supplied with electric power from the power supply 3. The memory system 1 operates by the electric power from the power supply 3. The host 2 or another device different from the host 2 may incorporate the power supply 3.

The memory system 1 receives an access request such as a read request and a write request from the host 2. The memory system 1 receives data to write together with the write request. Hereinafter, the data to write from the host 2 will be referred to as user data.

The memory system 1 includes a NAND flash memory (NAND memory) 10, a memory controller 11 that transfers data between the host 2 and the NAND memory 10, and a random access memory (RAM) 12.

Figure 2:
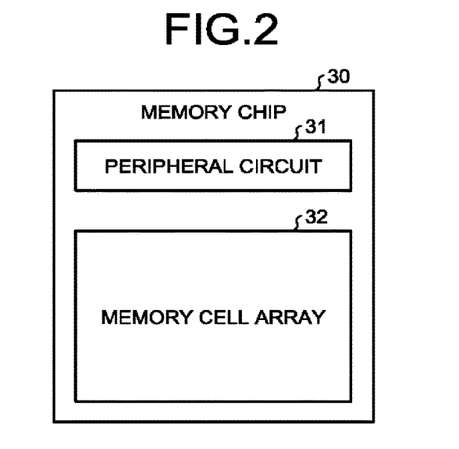
FIG. 2 is a view illustrating an exemplary configuration of a memory chip of the embodiment.

The NAND memory 10 is an example of a nonvolatile memory. The NAND memory 10 includes one or more memory chips 30. FIG. 2 is a view illustrating an exemplary configuration of a memory chip 30 according to the embodiment. As illustrated in the FIG. 2, each memory chip 30 includes a peripheral circuit 31 and a memory cell array 32.

The memory cell array 32 includes a plurality of blocks each of which is an assembly of nonvolatile memory cell transistors, i.e., memory cells. All the data is collectively erased from each block.

The peripheral circuit 31 includes, for example, a row decoder, a column decoder, a sense amplifier, a latch circuit, and a voltage generator circuit. When receiving a command from the memory controller 11, the peripheral circuit 31 executes one of program operation, read operation, and erase operation to the memory cell array 32, responding to the command.

Figure 3:
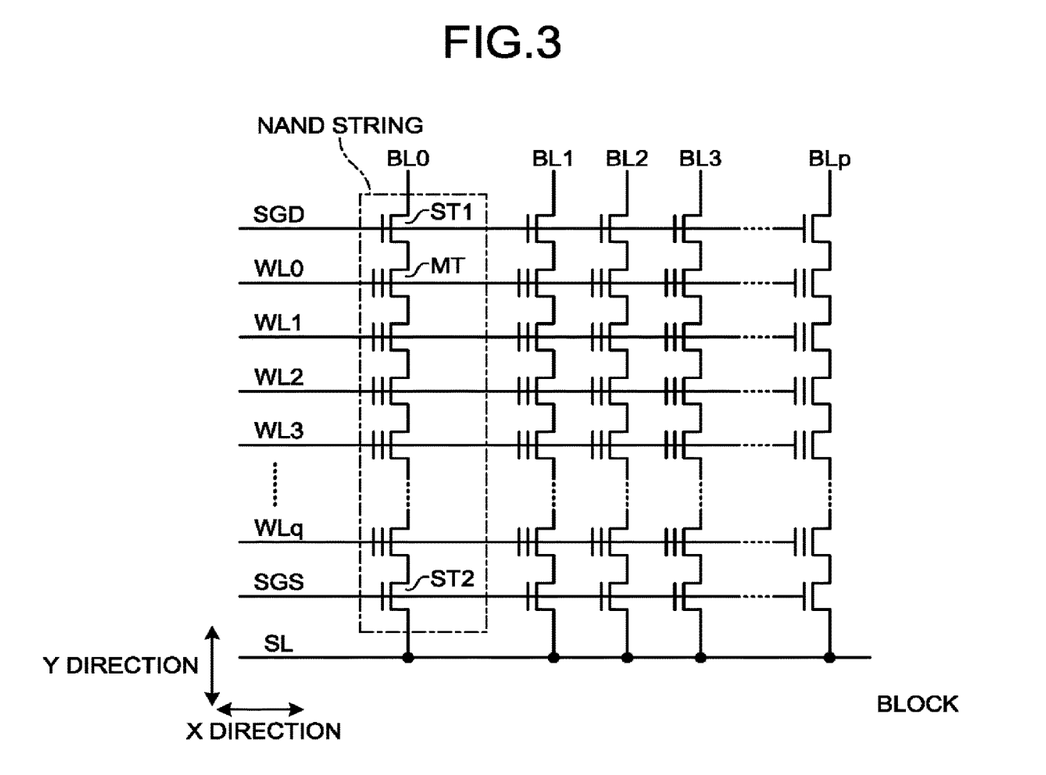
FIG. 3 is a circuit diagram illustrating an exemplary configuration of one block of a memory cell array.

FIG. 3 is a circuit diagram illustrating an exemplary configuration of one block of the memory cell array 32. As illustrated in FIG. 3, each of the blocks includes (p+1) NAND strings aligned in sequence in an X direction (p≥0). The (p+1) NAND strings include respective selection transistors ST1 with drains connected to bit lines BL0 to BLp, and gates commonly connected to a selection gate line SGD. The NAND strings also include respective selection transistors ST2 with sources commonly connected to a source line SL, and gates commonly connected to a selection gate line SGS.

The memory cells MT each include a metal oxide semiconductor field effect transistor (MOSFET) having a layered gate structure on a semiconductor substrate. The layered gate structure includes a floating gate formed on the semiconductor substrate through a tunnel oxide film, and a control gate electrode formed on the floating gate through an inter-gate insulating film. A threshold voltage varies in accordance with the number of electrons accumulated in the floating gate. Each of the memory cells MT stores data in accordance with a variation in the threshold voltage. That is, the memory cells MT retain, in the floating gates, charges of an amount corresponding to the data.

In each of the NAND strings, the (q+1) memory cells MT are arranged between the sources of the selection transistors ST1 and the drains of the selection transistors ST2 to connect their current paths in series. The control gate electrodes of the memory cells MT are connected to word lines WL0 to WLq in order starting from the memory cell MT closest to the drain. Thus, the drain of the memory cell MT connected to the word line WL0 is connected to the source of the selection transistor ST1, and the source of the memory cell MT connected to the word line WLq is connected to the drain of the selection transistor ST2.

The word lines WL0 to WLq commonly connects the control gate electrodes of the memory cells MT between the NAND strings in the block. That is, the control gate electrodes of the memory cells MT in the same row of the block are connected to the same word line WL. If each of the memory cells MT can retain a 1-bit value, the (p+1) memory cells MT connected to the same word line WL are handled as one page, and the memory cells MT are subjected to program operation and read operation in unit of page.

Each of the memory cells MT can store multiple-bit data. When each memory cell MT can store n-bit data (n≥2), for example, storage capacity per word line is equivalent to n-pages in size.

The memory chips 30 are operable in one of a mode in which multiple-bit data is stored in the respective memory cells MT, and a single level cell (SLC) mode in which one-bit data is stored in the memory cells MT, although multiple-bit data can be stored therein. A multi-level cell (MLC) mode in which two-bit data is stored in the memory cells MT will be described, as an example of the multiple-bit data storage mode.

Figure 4:
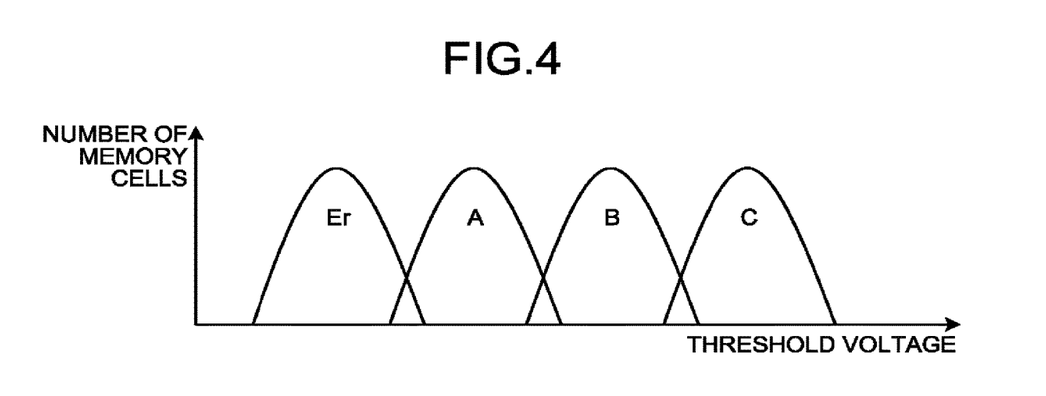
FIG. 4 is a view illustrating threshold voltage distributions of memory cells MT of the embodiment when data is written in multi-level cell (MLC) mode.

FIG. 4 is a view illustrating threshold voltage distributions of the memory cells MT of the embodiment when data is written in the MLC mode. In FIG. 4, the horizontal axis represents a threshold voltage, and the vertical axis represents the number of memory cells.

In writing data in the MLC mode, the threshold voltage of each memory cell is controlled to be included in any one of four distributions, a distribution Er, a distribution A, a distribution B, and a distribution C. The distribution Er, the distribution A, the distribution B, and the distribution C are correlated with "00", "01", "11", and "10" one to one. Thus, the memory cells MT can store two-bit data. The relationship between "00", "01", "11", and "10" and the respective distributions is not limited to the above example, and can be appropriately changed.

The distribution Er corresponds to an erased state. That is, the threshold voltage of the memory cell MT after erase operation is included in the distribution Er. Through program operation, the threshold voltage of the memory cell MT is maintained in the distribution Er or rises to one of the distributions A to C corresponding to data.

Specifically, in the program operation the peripheral circuit 31 performs, for example, the following operation. First, the peripheral circuit 31 selects one or more bit lines corresponding to a page to write. The peripheral circuit 31 selects a word line for the page to write, and applies a programming pulse to the selected word line, which injects an electron to a floating gate of a memory cell MT located at an intersection between the selected bit line and the selected word line. As a result, the threshold voltage of the memory cell MT rises.

The amount of increase in the threshold voltage through one application of the programming pulse differs in each memory cell MT. Data to store also differs in each memory cell MT. The peripheral circuit 31 includes a set target voltage, i.e., verify level for each of the distributions, and checks whether or not the threshold voltage reaches a verify level of a distribution corresponding to the data to store, upon every application of a programming pulse. This operation can be referred to as verify operation.

When finding a memory cell MT, of which the threshold voltage has not reached the verify level of the distribution corresponding to the data to store, the peripheral circuit 31 selects the memory cell MT, and applies the programming pulse thereto. By repeatedly applying the programming pulse until the threshold voltage reaches the verify level of the distribution corresponding to the data to store, the threshold voltages of all the memory cells MT connected to the selected word line are set within the distributions corresponding to the data to store.

The upper limit number of applications of the programming pulse is set by the memory controller 11 as a parameter. In the MLC mode the threshold voltage of the memory cell MT corresponding to each distribution is narrower in width than in a single level cell (SLC) mode to be described later. Thus, in the MLC mode the upper limit number of applications of the programming pulse is, for example, set to a greater value than in the SLC mode. In the following, the width of the threshold voltage corresponding to the distribution is simply referred to as a distribution width.

In the erase operation, the peripheral circuit 31 performs, for example, the following operation. The peripheral circuit 31 applies an erase voltage to the substrate of the memory cell array 32. The peripheral circuit 31 then allows all the word lines WL of a block to erase to be conducted to a ground potential. This discharges accumulated charges from the floating gate of each memory cell MT in the selected block, lowering the threshold voltage of each memory cell MT.

In the erase operation, a verify level corresponding to the distribution Er is set. The peripheral circuit 31 repeatedly applies the erase voltage to each memory cell MT of the selected block until the threshold drops to the verify level or less. Thereby, the threshold voltages of the memory cells MT in the selected block are set within the distribution Er.

A read level for read operation is set between every two adjacent distributions. In the MLC mode, the read level is set between the distribution Er and the distribution A, between the distribution A and the distribution B, and between the distribution B and the distribution C. In the read operation, the peripheral circuit 31 specifies a distribution of the threshold voltage of the memory cell MT on the basis of a result of comparison between the threshold voltage and the read level. The peripheral circuit 31 decodes the specified distribution into data corresponding to the distribution, and transmits the resultant data to the memory controller 11.

As illustrated in FIG. 4, two adjacent distributions may overlap at the bottom. In this case, the threshold of part of the memory cells MT in a certain distribution exceeds the read level and is included in another distribution adjacent thereto, which may cause erroneous data determination. That is, a bit error, that is, reading bit data different from programmed bit data, may occur. An error correction circuit (ECC) 20 of the memory controller 11 can correct corrupt data caused by the bit error.

Figure 5:
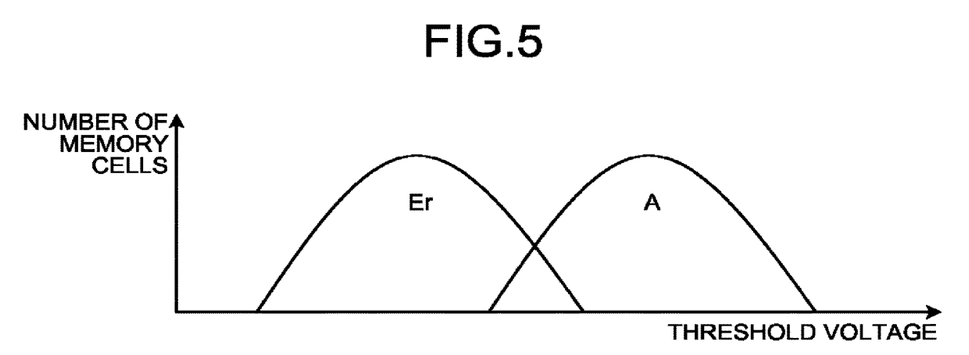
FIG. 5 is a view illustrating threshold voltage distributions of the memory cells MT of the embodiment when data is written in single level cell (SLC) mode (first SLC mode)

FIG. 5 is a view illustrating threshold voltage distributions of the memory cells MT of the embodiment when data is written in the SLC mode. In FIG. 5, the horizontal axis represents the threshold voltage, and the vertical axis represents the number of memory cells.

In the SLC mode, the program operation, the erase operation, and the read operation can be executed as in the in the MLC mode. However, the threshold voltage of each memory cell MT is controlled to be included in one of two distributions, distribution Er and distribution A. One of "0" and "1" is allocated to the distribution Er, and the other of "0" and "1" is allocated to the distribution A. Thereby, the memory cells MT can retain one-bit data.

The distribution Er corresponds to an erased state. That is, the threshold voltages of the memory cells MT after the erase operation are included in the distribution Er. Through program operation, the threshold voltages of the memory cells MT are maintained in the distribution Er or rises to the distribution A.

In the SLC mode, the number of distributions is less than in the MLC mode. That is, the width of the distributions is wider than in the MLC mode. The narrower the width of the distributions is, the greater the required number of applications of the programming pulse is. Thus, in the SLC mode, the program operation is completed through a less number of applications of the programming pulse, than in the MLC mode.

In addition, in the SLC mode, the width of the distribution Er can be widened from that in the MLC mode. Thus, in the SLC mode, the erase operation is completed through a less number of applications of an erase voltage than that in the MLC mode.

The number of applications of the programming pulse or the erase voltage will affect processing speed, power consumption, and progress of wear-out of the memory cells MT. The greater the number of applications of the programming pulse or the erase voltage is, the slower the processing speed is, the greater the power consumption is, and the faster the progress of wear-out of the memory cells MT is. In other words, in the SLC mode, in exchange for a lower retainable data capacity than in the MLC mode, faster processing speed, lower power consumption, slower progress of wear-out of the memory cells MT are feasible.

In the embodiment, each of the memory chips 30 is operable in another SLC mode different from the SLC mode described with reference to FIG. 5. Hereinafter, the SLC mode with reference to FIG. 5 is referred to as a first SLC mode. The SLC mode different from the first SLC mode is referred to as a second SLC mode.

Figure 6:
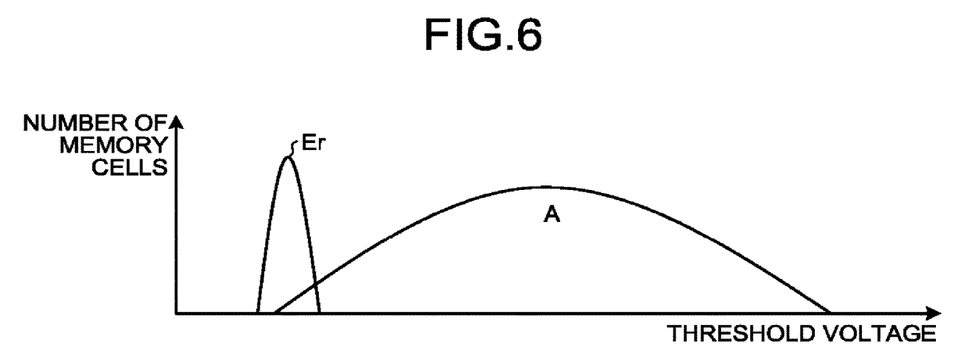
FIG. 6 is a view illustrating threshold voltage distributions of the memory cells MT of the embodiment when data is written in second SLC mode.

FIG. 6 is a view illustrating threshold voltage distributions of the memory cells MT of the embodiment when data is written in the second SLC mode. In FIG. 6, the horizontal axis represents the threshold voltage, and the horizontal axis represents the number of memory cells.

In the second SLC mode, the upper limit number of applications of the programming pulse is set to a smaller value (for example, "1") than that in the first SLC mode. As a result, as illustrated in FIG. 6, the distribution A is wider in width in the second SLC mode than in the first SLC mode.

In the second SLC mode, the program operation is completed through a less number of applications of the programming pulse than in the first SLC mode. Thus, according to the second SLC mode, the processing speed is faster and the power consumption is lower than in the first SLC mode.

In addition, according to the second SLC mode, as illustrated in FIG. 6, the width of the distribution Er is narrower than in the first SLC mode. This is implemented by setting the verify level for erase operation to a lower value in the second SLC mode than in the first SLC mode. Lowering the verify level for the erase operation increases the number of applications of the erase voltage but reduces the width of the distribution Er.

In the first SLC mode and the second SLC mode, the width of the distribution Er may be the same. Narrowing the width of the distribution Er in the first SLC mode from that in the second SLC mode makes it possible to reduce the overlapping area between the distribution Er and the distribution A, which can reduce the frequency at which a bit error occurs in read operation.

As described above, each of the memory chips 30 is operable in any of the MLC mode, the first SLC mode, and the second SLC mode. A mode selecting method by the memory controller 11 for data writing will be described later.

Referring back to FIG. 1, the RAM 12 is an example of a volatile memory. The RAM 12 is made up of, for example, a dynamic random access memory (DRAM), a static random access memory (SRAM), or a combination thereof. The memories forming the volatile memory are not limited thereto. The memory system 1 can include an arbitrary volatile memory instead of the RAM 12.

Receiving user data from the host 2, the memory controller 11 stores the user data (user data 22 in FIG. 1) in the RAM 12, and writes the user data 22 from the RAM 12 to the NAND memory 10 at certain timing.

The memory controller 11 can store management data 21 in the RAM 12. The management data 21 refers to data to be used in the memory system 1 for managing the memory system 1. That is, the management data 21 is of a different type from that of the user data received from the host 2.

The management data 21 includes, for example, a logical to physical conversion table. The logical to physical conversion table represents information for correlating address information being logical address indicating a location in a logical address space provided by the memory system 1 to the host 2, with address information being physical address indicating a physical location (in the memory cell array 32) in the NAND memory 10.

The NAND memory 10 contains the logical to physical conversion table, for example, in a certain location. The memory controller 11 caches part or all of the logical to physical conversion table into the RAM 12 as the management data 21. When accessing the NAND memory 10, the memory controller 11 refers to or updates the logical to physical conversion table cashed in the RAM 12. The memory controller 11 writes at least an updated portion of the logical to physical conversion table cashed in the RAM 12 to the NAND memory 10 at certain timing.

The management data 21 is not limited to the logical to physical conversion table. For example, the RAM 12 may store information on recorded access counts for each certain storage region (for example, a block) as the management data 21.

The memory controller 11 includes, for example, a processor. The processor implements various kinds of control including data transmission between the host 2 and the NAND memory 10 by a certain firmware program.

The memory controller 11 may be configured as one system-on-a-chip (SoC) or a plurality of chips. The memory controller 11 may include the RAM 12 inside.

In addition, the memory controller 11 may include a field-programmable gate array (FPGA) or an application specific integrated circuit (ASIC) in combination with or instead of the processor. That is, the memory controller 11 may be configured by software, hardware, or a combination of both.

The memory controller 11 further includes an ECC 20.

The ECC 20 performs data encoding for detection and correction of a bit error before the data is written to the NAND memory 10. That is, encoded data is written to the NAND memory 10.

The ECC 20 decodes the encoded data read from the NAND memory 10 to detect a bit error from the data. When detecting a bit error, the ECC 20 corrects corrupt data due to the bit error to proper data.

Encoding and decoding method by the ECC 20 can be an arbitrary method. The ECC 20 may adopt BCH encoding or low-density parity-check (LDPC) encoding, for example. The ECC 20 may employ a correcting-capability variable method as the encoding and decoding method.

The processor may detect or correct the bit error.

The memory system 1 further includes a power supply circuit 13 and a capacitor 14.

The power supply circuit 13 is supplied with electric power from the power supply 3 and supplies the power to the NAND memory 10, the memory controller 11, and the RAM 12 with or without conversion. The memory controller 11, the NAND memory 10, and the RAM 12 operate by the power supply form the power supply circuit 13.

The capacitor 14 represents a chargeable battery. The capacitor 14 is charged by the power supply circuit 13 while supplied with electric power from the power supply 3. Upon abrupt stop of the power supply from the power supply 3, the power supply circuit 13 switches the power supply from the power supply 3 to the capacitor 14. Thereby, the electric power accumulated in the capacitor 14 is supplied to the NAND memory 10, the memory controller 11, and the RAM 12 through the power supply circuit 13. After the power supply from the power supply 3 is stopped, the memory controller 11, the NAND memory 10, and the RAM 12 can operate by the accumulated power in the capacitor 14 for a while.

As an example, the power supply circuit 13 monitors the voltage of the power supply 3. With the voltage being below a certain threshold value, the power supply circuit 13 determines stop of the power supply from the power supply 3, and transmits a power shutdown signal to the memory controller 11. In addition, the power supply circuit 13 switches the power supply from the power supply 3 to the capacitor 14. The memory controller 11 may transmit a switch signal to the power supply circuit 13 in response to the reception of the power shutdown signal, and the power supply circuit 13 may switch the power supply in accordance with the switch signal.

The memory system 1 can include an arbitrary battery as the capacitor 14, for example, an electrolytic capacitor or an electrical double layer capacitor.

In the following, an operation mode based on the power supply from the power supply 3 is referred to as a normal operation mode. An operation mode based on the accumulated power in the capacitor 14 is referred to as a PLP mode. That is, the memory system 1 operates in the normal operation mode while supplied with electric power from the power supply 3. When the power supply circuit 13 switches the power supply from the power supply 3 to the capacitor 14, the memory system 1 transitions from the normal operation mode to the PLP mode.

In the normal operation mode, the memory controller 11 uses the MLC mode for writing the user data 22 to the NAND memory 10, and uses the first SLC mode for writing the management data 21 to the NAND memory 10.

The memory controller 11 writes the user data 22 in the MLC mode in which a greater number of bits of data is stored in each of the memory cell MT than in the SLC mode, which can increase the capacity of a storage region to be provided to the host 2 as much as possible.

The memory controller 11 writes the management data 21 in the first SLC mode in which the memory cells are worn out more slowly than in the MLC mode, which can decrease the risk of loss of the management data 21 from the memory system 1.

In the PLP mode, the memory controller 11 writes data such as the user data 22 and the management data 21 from the RAM 12 to the NAND memory 10 in the second SLC mode.

In the second SLC mode, program operation is completed through a less number of applications of a programming pulse than in the MLC mode or the first SLC mode, which can improve the processing speed and decrease power consumption from those in the MLC mode or the first SLC mode. The memory controller 11 uses the second SLC mode in the PLP mode, to be able to lower the power consumption for writing data to the NAND memory 10 from the RAM 12. That is, the capacitor 14 having a smaller capacity can save data from the RAM 12.

The capacitor 14 can be a battery with a smaller capacity, which enables cost reduction in the memory system 1.

The memory controller 11 writes data from the RAM 12 to the NAND memory 10 in the PLP mode, which can prevent the memory system 1 from losing the data stored in the RAM 12.

Next, the operation of the memory system 1 according to the embodiment will be described.

Figure 7:
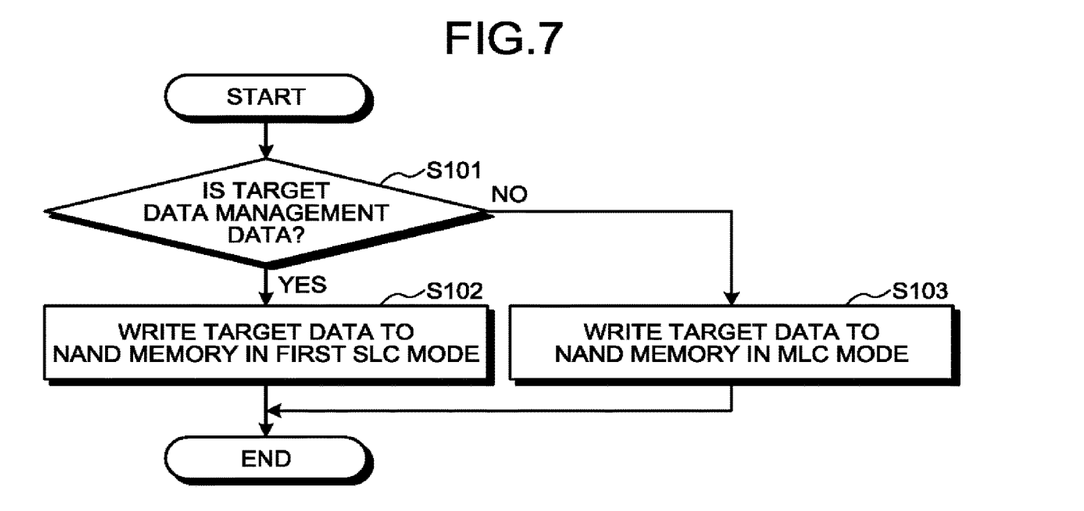
FIG. 7 is a flowchart illustrating an overview of a data write operation in a normal operation mode of the memory system of the embodiment.

FIG. 7 is a flowchart illustrating an overview of a data write operation in the normal operation mode executed by the memory system 1 according to the embodiment.

Either the management data 21 or the user data 22 stored in the RAM 12 is data to write. In FIG. 7, data to write is referred to as target data.

The memory system 1 operates differently depending on target data, the management data 21 or the user data 22. When the management data 21 is target data (Yes in S101), the memory controller 11 writes the target data to the NAND memory 10 in the first SLC mode (S102). When the management data 21 is not target data (NO in S101), that is, the user data 22 is the target data, the memory controller 11 writes the target data to the NAND memory 10 in the MLC mode (S103). By S102 or S103, the write operation is completed.

Figure 8:
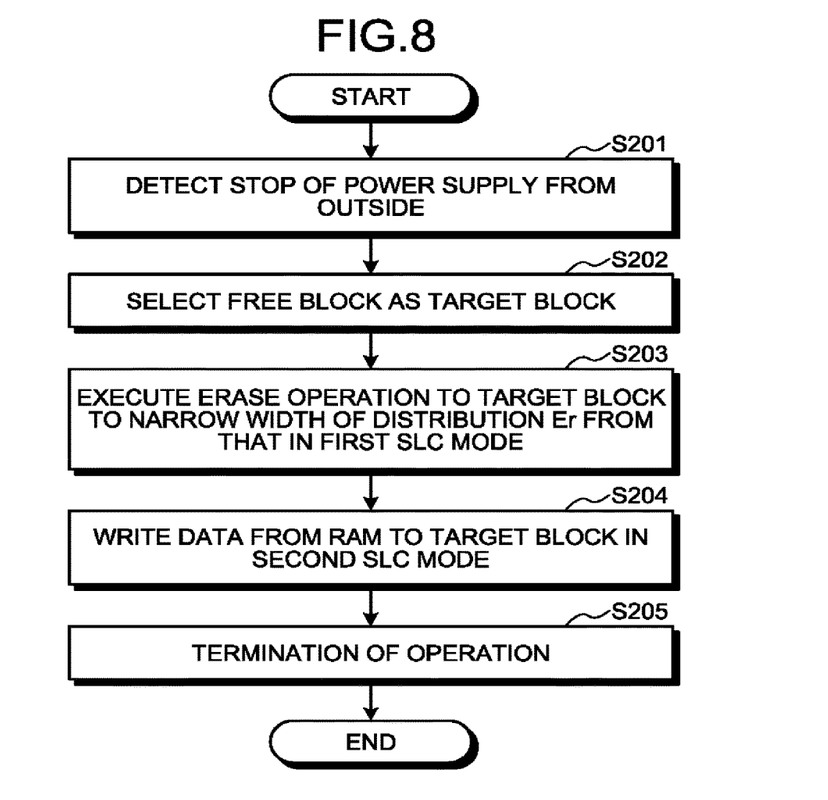
FIG. 8 is a flowchart illustrating an overview of an operation in a PLP mode of the memory system of the embodiment.

FIG. 8 is a flowchart illustrating an overview of an operation in the PLP mode executed by the memory system 1 according to the embodiment.

When detecting stop of a power supply from the power supply 3 (S201), the memory controller 11 initiates an operation in the PLP mode. Specifically, the memory controller 11 first selects one free block (S202). The free block selected in S202 is referred to as a target block.

The free block represents a block in which all the written user data are invalidated. Invalidation of data represents that there is no logical address associated with a physical address of a storage region in which data is stored. Valid data represents that a logical address associated with a physical address of a storage region in which the data is stored exists. The free block can be generated through garbage collection, for example.

Garbage collection refers to transcribing valid data from an arbitrary block (a first block) to another block (a second block), and regarding all the data stored in the first block as invalid data. By garbage collection, the first block becomes a free block.

The memory controller 11 performs the garbage collection, and registers the free block generated by the garbage collection in a free block pool. In S202, the memory controller 11 selects one of one or more blocks from the free block pool as a target block.

Subsequent to S202, the memory controller 11 executes erase operation to the target block to narrow the width of the distribution Er from that in the first SLC mode (S203). That is, the memory controller 11 executes the erase operation so that the threshold voltages of all the memory cells MT in the target block are included in the distribution Er of the second SLC mode.

The memory controller 11 transmits, for example, a command for designating the verify level and an erase command to a memory chip 30 including the target block. In the memory chip 30 including the target block, the peripheral circuit 31 repeatedly applies an erase voltage until the threshold voltages of the memory cells MT in the target block come to be equal to or below the verify level designated by the command from the memory controller 11.

In the second SLC mode, the value of the verify level is smaller than in the first SLC mode. Thereby, the threshold voltage of each of the memory cells MT in the target block can be decreased from that in the first SLC mode, making it possible to narrow the width of the distribution Er in the second SLC mode from that in the first SLC mode.

Subsequent to S203, the memory controller 11 writes data, i.e., management data 21 and user data 22 from the RAM 12 to the target block in the second SLC mode (S204). This completes the operation in the PLP mode.

Figure 9:
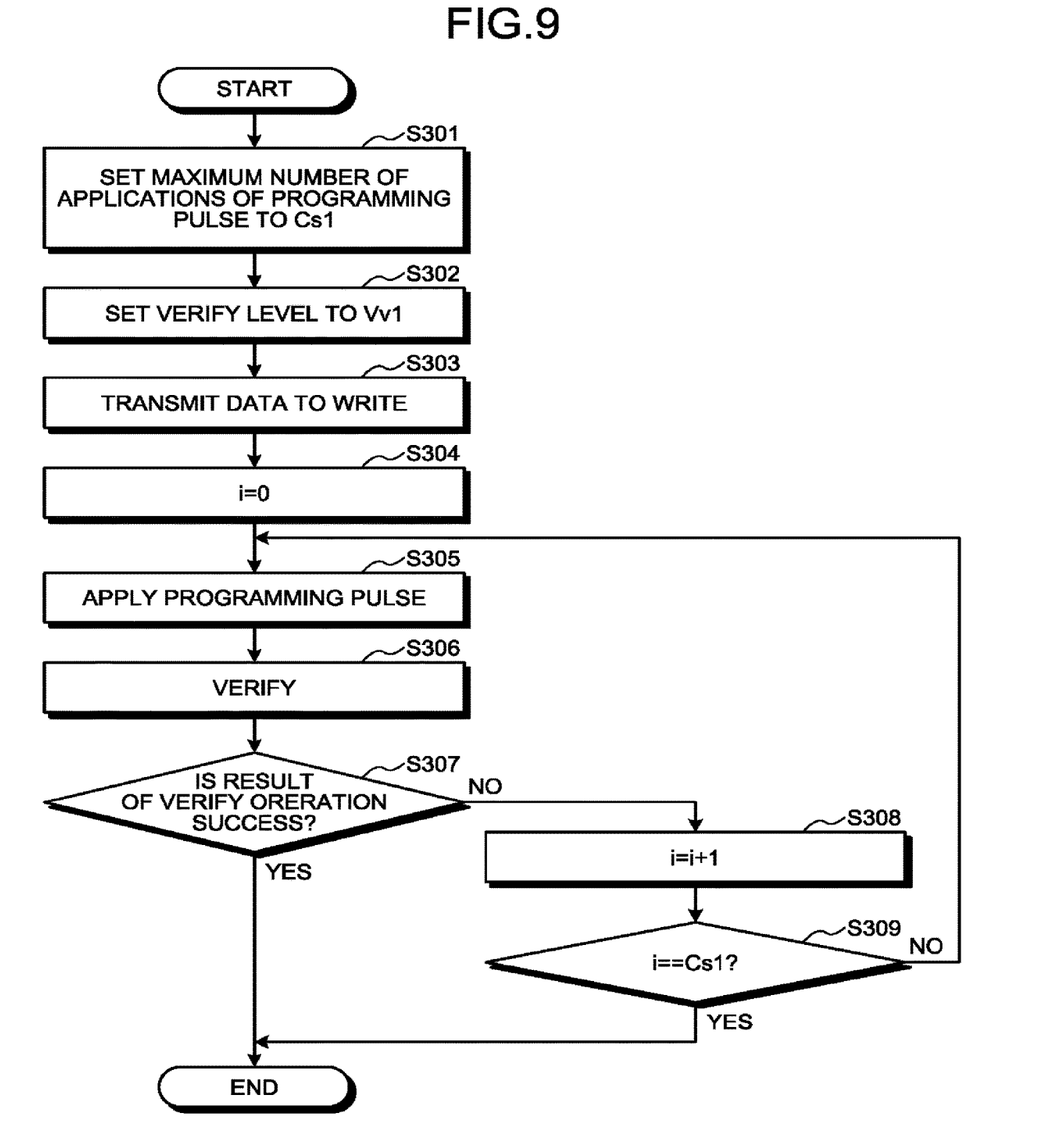
FIG. 9 is a flowchart illustrating an exemplary data write operation in the first SLC mode of the memory system of the embodiment.

FIG. 9 is a flowchart illustrating an example of a data write operation in the first SLC mode executed by the memory system 1 according to the embodiment. For example, the operation in FIG. 9 is executed in S102 in FIG. 7.

First, the memory controller 11 sets the upper limit number of applications of the programming pulse to a certain value (denoted by Cs1) (S301). Cs1 represents, for example, the maximum number of applications of the programming pulse necessary for setting, to the distribution A in the first SLC mode, the threshold voltages of memory cells MT as a write destination corresponding to the distribution A. Cs1 is determined in advance through calculation or experiment, for example. In S301, for example, the memory controller 11 notifies a memory chip 30 being a data write destination of Cs1.

Subsequent to S301, the memory controller 11 sets the verify level to a certain value (denoted by Vv1) (S302). Vv1 represents a voltage value corresponding to the distribution A in the first SLC mode. Vv1 is determined in advance through calculation or experiment, for example. In S302, for example, the memory controller 11 notifies a memory chip 30 being a write destination of Vv1.

Subsequent to S302, the memory controller 11 transmits data to write to the memory chip 30 being a write destination (S303).

In the memory chip 30 being a write destination, the peripheral circuit 31 initializes i to zero (S304). In FIG. 9, the value of i corresponds to the number of executed loop operations in S305 to S309.

Next, the peripheral circuit 31 applies the programming pulse (S305). The peripheral circuit 31 executes verify operation using Vv1 (S306).

The peripheral circuit 31 determines whether or not a result of the verify operation is a success (S307).

When the threshold voltages of all the memory cells MT being data write destinations corresponding to the distribution A exceeds Vv1, for example, the peripheral circuit 31 determines that the verify operation is successful. When the threshold voltages of part or all of the memory cells MT being write destinations corresponding to the distribution A have not reached Vv1, the peripheral circuit 31 determines that the verify operation is unsuccessful.

When the result of the verify operation is not a success (NO in S307), the peripheral circuit 31 increments the value of i by 1 (S308), and determines whether or not the value of i has reached Cs1 (S309). When the value of i has not reached Cs1 (NO in S309), the memory system 1 returns to the control in S305.

When the result of the verify operation is a success (YES in S307) or the value of i has reached Cs1 (YES in S309), the memory system 1 completes data write in the first SLC mode.

Figure 10:
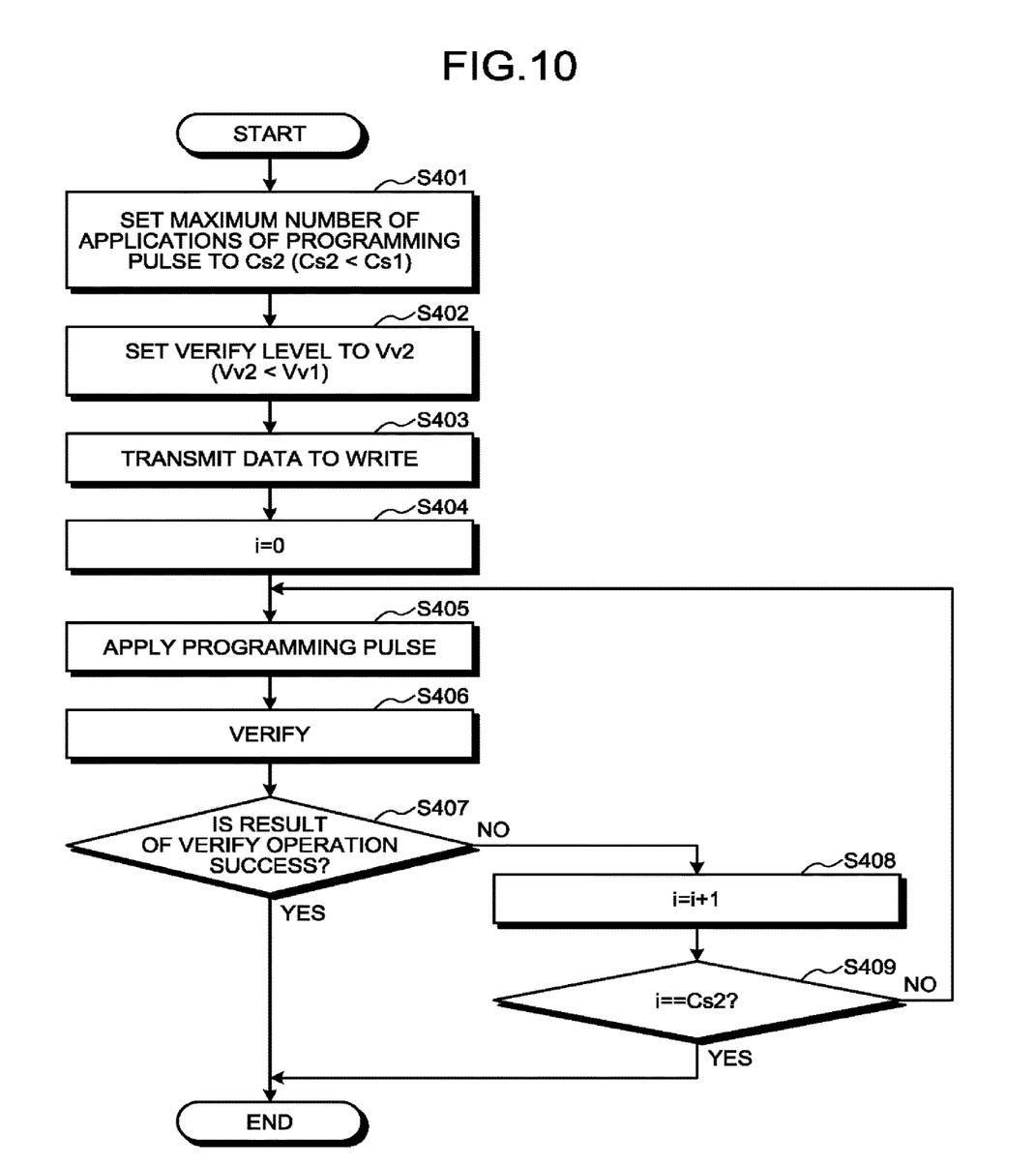
FIG. 10 is a flowchart illustrating an exemplary data write operation in the second SLC mode of the memory system of the embodiment.

FIG. 10 is a flowchart illustrating an example of a data write operation in the second SLC mode executed by the memory system 1 according to the embodiment. For example, the operation in FIG. 10 is executed in S204 in FIG. 8.

First, the memory controller 11 sets the upper limit number of applications of the programming pulse to a certain value (denoted by Cs2) (S401). Cs2 represents, for example, the maximum number of applications of the programming pulse necessary for setting, for the distribution A in the second SLC mode, the threshold voltages of memory cells MT being data write destinations corresponding to the distribution A. Cs2 is smaller than Cs1. Cs2 is determined in advance through calculation or experiment. In S401, for example, the memory controller 11 notifies a memory chip 30 being a data write destination of Cs2.

Subsequent to S401, the memory controller 11 sets the verify level to a certain value (denoted by Vv2) (S402). Vv2 represents a voltage value corresponding to the distribution A in the second SLC mode. Vv2 is smaller than Vv1. Vv2 is determined in advance through calculation or experiment. In S402, for example, the memory controller 11 notifies a memory chip 30 being a write destination of Vv2.

Subsequent to S402, the memory controller 11 transmits data to write to the memory chip 30 being a write destination (S403).

In the memory chip 30 being a write destination, the peripheral circuit 31 initializes i to zero (S404). In FIG. 10, the value of i corresponds to the number of executed loop operations of S405 to S409.

Next, the peripheral circuit 31 applies the programming pulse (S405). The peripheral circuit 31 executes verify operation using Vv2 (S406).

The peripheral circuit 31 determines whether or not a result of the verify operation is a success (S407).

When the threshold voltages of all the memory cells MT being data write destinations corresponding to the distribution A exceed Vv2, for example, the peripheral circuit 31 determines that the result of the verify operation is a success. When the threshold voltages of part or all of the memory cells MT being data write destinations corresponding to the distribution A have not reached Vv2, the peripheral circuit 31 determines that the result of the verify operation is not a success.

With the result of the verify operation being not a success (NO in S407), the peripheral circuit 31 increments the value of i by 1 (S408), and determines whether or not the value of i has reached Cs2 (S409). When the value of i has not reached Cs2 (NO in S409), the memory system 1 returns to the control in S405.

When the result of the verify operation is a success (YES in S407) or the value of i has reached Cs2 (YES in S409), the memory system 1 completes data write in the second SLC mode.

As described above, according to the embodiment, in the normal operation mode, the memory controller 11 writes the management data 21 from the RAM 12 to the NAND memory 10 in the first SLC mode. Upon stop of the power supply from the power supply 3, that is, when transitioning to the PLP mode, the memory controller 11 writes the data as the user data 22 and the management data 21 from the RAM 12 to the NAND memory 10 in the second SLC mode.

In the PLP mode, thus, the memory controller 11 is configured to execute data write from the RAM 12 to the NAND memory 10 in the SLC mode (second SLC mode) different from the SLC mode (first SLC mode) of the normal operation mode. In the PLP mode, the memory controller 11 employs one of the two SLC modes, the one with less power consumption, enabling reduction in total power consumption necessary for writing data from the RAM 12 to the NAND memory 10. As a result, by the capacitor 14 having a smaller capacity, data can be saved from the RAM 12.

In addition, according to the embodiment, in the second SLC mode the upper limit number of applications of the programming pulse to each of the memory cells MT is smaller than in the first SLC mode.

This makes it possible to decrease, in the PLP mode, total power consumption necessary for writing data from the RAM 12 to the NAND memory 10. As a result, by the capacitor 14 having a smaller capacity, data can be saved from the RAM 12. Further, the use of a capacitor having a small capacitor can result in cost reduction in the memory system 1.

According to the embodiment, in the first SLC mode and the second SLC mode, the memory controller 11 controls the threshold voltage of each of the memory cells MT to be included in one of the distribution Er corresponding to an erased state and the distribution A different from the distribution Er. The memory controller 11 increases the width of the distribution A in the second SLC mode from that in the first SLC mode.

Specifically, as described above, the memory controller 11 sets the number of applications of the programming pulse to the memory cells MT smaller in the second SLC mode than in the first SLC mode, thereby widening the width of the distribution A in the second SLC mode from that in the first SLC mode. The width of the distribution A can be widened by reducing the number of applications of the programming pulse to the memory cells MT.

In addition, according to the embodiment, the memory controller 11 sets the width of the distribution Er smaller in the second SLC mode than in the first SLC mode.

Setting the width of the distribution Er narrower than in the first SLC mode can maintain a smaller overlapping bottom area between the distribution Er and the distribution A, even if the distribution A becomes wider than in the first SLC mode. That is, it is possible to reduce the number of applications of the programming pulse while reducing the occurrence of bit error in the read operation.

In the second SLC mode, the memory controller 11 sets the verify level of the erase operation to a lower value than in the first SLC mode, thereby narrowing the width of the distribution Er in the second SLC mode from that in the first SLC mode.

According to the embodiment, in the PLP mode, the memory controller 11 writes the user data 22 from the RAM 12 to the NAND memory 10 in the second SLC mode. That is, the memory controller 11 writes the data, which has been received from the host 2 and has not been completely written to the NAND memory 10, to the NAND memory 10 in the second SLC mode.

Thus, even if the power supply abruptly stops, the memory system 1 can be prevented from losing the data, which has been received from the host 2 and has not been completely written to the NAND memory 10.

The embodiment is applicable to a method called foggy-fine writing. The foggy-fine writing refers to a method of writing target data to one word line in twice. The first one of the two writings is referred to as foggy writing and the second one is referred to as fine writing. To write the user data 22 to the NAND memory 10, for example, in the normal operation mode, the memory controller 11 holds the user data 22 in the RAM 12 until completion of the fine writing, and deletes the user data 22 from the RAM 12 after completion of the fine writing. When the power supply from the power supply 3 stops before completion of the fine writing, the memory controller 11 transitions to the PLP mode, and can write the user data 22 to the NAND memory 10 in the second SLC mode.

In addition, according to the embodiment, in the PLP mode, the memory controller 11 writes the management data 21 from the RAM 12 to the NAND memory 10 in the second SLC mode.

The management data 21 is used for managing the memory system 1. The term "use" includes updating. That is, the management data 21 can be updated. The memory controller 11 writes the management data 21 to the NAND memory 10 in the PLP mode, which can prevent the memory system 1 from losing the latest management data 21 at the time of sudden stop of the power supply to the memory system 1.

In addition, according to the embodiment, in the normal operation mode, the memory controller 11 can write the management data 21 from the RAM 12 to the NAND memory 10 in the first SLC mode.

According to the embodiment, in the normal operation mode, the memory controller 11 writes the user data 22 from the RAM 12 to the NAND memory 10 in the MLC mode.

Thus, the number of bits of data to be written to each of the memory cells MT can be increased, whereby the memory system 1 can provide a larger capacity of a storage region, i.e., a larger user capacity to the host 2.

The above embodiment has described the MLC mode as an example of write mode in which multiple-bit data is written to each of the memory cells. Alternatively, a write mode in which three or more bit-data is written to each memory cell can be employed. For example, a triple level cell (TLC) mode in which three-bit data is written to each memory cell, or a quad level cell (QLC) mode in which four-bit data is written to each memory cell is adoptable.

The above embodiment has described the memory cell array 32 including the two-dimensionally arranged memory cells MT, by way of example. The memory cell array 32 may include three-dimensionally arranged memory cells MT. In this case, for example, a layered element of alternately layered conductive films and insulating films through which a columnar semiconductor penetrates is prepared, and the memory cells MT are mounted at intersections of the conductive films and the columnar semiconductor.

The above embodiment has omitted describing a data write operation in the MLC mode. The upper limit number of applications of the programming pulse or the verify level can be arbitrarily set as long as the threshold voltage distributions of the memory cells MT after data writing can be set to those illustrated in FIG. 4.

The above embodiment has omitted describing an operation after the power supply from the power supply 3 is resumed. After the power supply from the power supply 3 is resumed, the memory controller 11 can execute an arbitrary operation. For example, the memory controller 11 may read data such as the management data 21 and the user data 22 written in the second SLC mode from the NAND memory 10, and may store the read data in the RAM 12. In such manner, the memory system 1 can return to the state immediately before the stop of power supply from the power supply 3.

How to read data written in the second SLC mode is not limited to a specific method. For example, the memory controller 11 transmits to each of the memory chips 30 a read command for data written in the second SLC mode. The memory controller 11 receives the data from the memory chip 30 and detects and corrects an error bit with the ECC 20. With a failure in correcting the error bit with the ECC 20, the memory controller 11 changes a read level, and transmits a read command for the data written in the second SLC mode again. Thus, the memory controller 11 may repeat read operations while changing the read level until it can acquire correct data.

In addition, the memory controller 11 may set different correcting capabilities of the ECC 20 in writing data in the first SLC mode and in writing data in the second SLC mode. To write data in the second SLC mode, for example, the memory controller 11 sets a greater correction capability of the ECC 20 than to write data in the first SLC mode. This makes it possible to more likely read correct data from data written in the second SLC mode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a storage region that includes a plurality of memory cells;
   a volatile memory;
   a capacitor configured to accumulate electric power; and
   a memory controller configured to
   write first data stored in the volatile memory to the storage region in a first mode, using a power supply from outside, the first mode being a mode in which one-bit data is written to each of the memory cells, and
   write, upon stop of the power supply from the outside, the first data to the storage region in a second mode, using the electric power accumulated in the capacitor, the second mode being a mode in which one-bit data is written to each of the memory cells and being different from the first mode.

2. The memory system according to claim 1, wherein in writing the first data in the second mode, an upper limit number of applications of a programming pulse to each of the memory cells is smaller than in writing the first data in the first mode.

3. The memory system according to claim 1, wherein the memory controller
   designates a first verify level before writing the first data in the first mode to erase the storage region in which the first data is written in the first mode, and
   designates a second verify level before writing the first data in the second mode to erase the storage region in which the first data is written in the second mode, the second verify level being lower in voltage value than the first verify level.

4. The memory system according to claim 1, wherein the data written to each of the memory cells corresponds to a first distribution or a second distribution, the first distribution being a distribution of the memory cells each of which a threshold voltage corresponds to an erased state, the second distribution being different from the first distribution, and
   the second distribution is wider in width in the second mode than in the first mode.

5. The memory system according to claim 1, wherein the data written to each of the memory cells corresponds to a first distribution or a second distribution, the first distribution being a distribution of the memory cells each of which a threshold voltage corresponds to an erased state, the second distribution being different from the first distribution, and
   the first distribution is narrower in width in the second mode than in the first mode.

6. The memory system according to claim 2, wherein the memory controller
   designates a first verify level before writing the first data in the first mode to erase the storage region in which the first data is written in the first mode, and
   designates a second verify level before writing the data in the second mode to erase the storage region in which the first data is written in the second mode, the second verify level being lower in voltage value than the first verify level.

7. The memory system according to claim 2, wherein the data written to each of the memory cells corresponds to a first distribution or a second distribution, the first distribution being a distribution of the memory cells each of which a threshold voltage corresponds to an erased state, the second distribution being different from the first distribution, and
   the second distribution is wider in width in the second mode than in the first mode.

8. The memory system according to claim 3, wherein the data written to each of the memory cells corresponds to a first distribution or a second distribution, the first distribution being a distribution of the memory cells each of which a threshold voltage corresponds to an erased state, the second distribution being different from the first distribution, and
   the second distribution is wider in width in the second mode than in the first mode.

9. The memory system according to claim 2, wherein the data written to each of the memory cells corresponds to a first distribution or a second distribution, the first distribution being a distribution of the memory cells each of which a threshold voltage corresponds to an erased state, the second distribution being different from the first distribution, and the first distribution is narrower in width in the second mode than in the first mode.

10. The memory system according to claim 3, wherein the data written to each of the memory cells corresponds to a first distribution or a second distribution, the first distribution being a distribution of the memory cells each of which a threshold voltage corresponds to an erased state, the second distribution being different from the first distribution, and the first distribution is narrower in width in the second mode than in the first mode.

11. The memory system according to claim 4, wherein the data written to each of the memory cells corresponds to a first distribution or a second distribution, the first distribution being a distribution of the memory cells each of which a threshold voltage corresponds to an erased state, the second distribution being different from the first distribution, and the first distribution is narrower in width in the second mode than in the first mode.

12. The memory system according to claim 1, wherein the memory system is connected to a host, the first data includes second data designated by a write command from the host, and upon stop of the power supply from the outside, the memory controller writes the second data in the second mode, using the electric power accumulated in the capacitor.

13. The memory system according to claim 1, wherein the memory system is connected to a host, each of the memory cells retains multiple-bit data, and the memory controller writes, using the power supply from the outside, second data to each of the memory cells of the storage region as the multiple-bit data, the second data being designated by a write command from the host.

14. The memory system according to claim 1, wherein the first data includes data for management of the memory system.

15. The memory system according to claim 1, further comprising a power supply circuit that while receiving the power supply from the outside, supplies electric power to the memory controller and charges the capacitor, using the power supply from the outside, and upon stop of the power supply from the outside, supplies the electric power accumulated in the capacitor to the memory controller.

16. A method of controlling a memory system comprising a nonvolatile memory including a storage region that includes a plurality of memory cells, a volatile memory, and a capacitor configured to accumulate electric power, the method comprising:

writing first data stored in the volatile memory to the storage region in a first mode, using a power supply from outside, the first mode being a mode in which one-bit data is written to each of the memory cells; and writing, upon stop of the power supply from the outside, the first data to the storage region in a second mode different from the first mode, using the electric power accumulated in the capacitor, the second mode being a mode in which one-bit data is written to each of the memory cells.

17. The method according to claim 16, wherein in writing the first data in the second mode, an upper limit number of applications of a programming pulse to each of the memory cells is smaller than in writing the first data in the first mode.

18. The method according to claim 16, further comprising:

designating a first verify level before writing the first data in the first mode to erase the storage region in which the first data is written in the first mode; and designating a second verify level before writing the first data in the second mode to erase the storage region in which the first data is written in the second mode, the second verify level being lower in voltage value than the first verify level.

19. The method according to claim 16, wherein the data written to each of the memory cells corresponds to a first distribution or a second distribution, the first distribution being a distribution of the memory cells each of which a threshold voltage corresponds to an erased state, the second distribution being different from the first distribution, and the second distribution is wider in width in the second mode than in the first mode.

20. The method according to claim 16, wherein the data written to each of the memory cells corresponds to a first distribution or a second distribution, the first distribution being a distribution of the memory cells each of which a threshold voltage corresponds to an erased state, the second distribution being different from the first distribution, and the first distribution is narrower in width in the second mode than in the first mode.

* * * * *